(12) United States Patent  
Mangaser et al.

(10) Patent No.: US 12,101,135 B2
(45) Date of Patent: Sep. 24, 2024

(54) NOISE MITIGATION IN SINGLE-ENDED LINKS

(71) Applicant: Advanced Micro Devices, Inc., Santa Clara, CA (US)

(72) Inventors: Ramon Mangaser, Arlington, MA (US); Karthik Gopalakrishnan, Cupertino, CA (US); Andy Huei Chu, Saratoga, CA (US); Pradeep Jayaraman, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 18/243,243

(22) Filed: Sep. 7, 2023

(65) Prior Publication Data

US 2023/0421203 A1 Dec. 28, 2023

Related U.S. Application Data

(63) Continuation of application No. 17/545,108, filed on Dec. 8, 2021, now Pat. No. 11,757,489.

(60) Provisional application No. 63/232,343, filed on Aug. 12, 2021.

(51) Int. Cl.
*H04B 3/56* (2006.01)
*G05F 1/46* (2006.01)
*H04B 3/06* (2006.01)

(52) U.S. Cl.
CPC ............... *H04B 3/56* (2013.01); *G05F 1/46* (2013.01); *H04B 3/06* (2013.01)

(58) Field of Classification Search
CPC .... H03F 3/24; H04B 3/56; H04B 3/06; H04B 1/16; H04B 10/40; H04B 10/50; H04B 2001/0408; G05F 1/46
See application file for complete search history.

(56) References Cited

U.S. PATENT DOCUMENTS

| 8,867,595 | B1 | 10/2014 | Luo et al. |
| 8,891,685 | B2 | 11/2014 | Hollis |
| 9,736,709 | B2 | 8/2017 | De Ruijter et al. |
| 10,230,370 | B2 | 3/2019 | Guo et al. |
| 2003/0080774 | A1 | 5/2003 | Funaba |

(Continued)

OTHER PUBLICATIONS

David Maliniak; "The Fundamentals of PAM-4"; white paper; EDN; Jul. 16, 2014; downloaded from URL https://www.edn.com/the-fundamentals-of-pam4; 3 pages.

(Continued)

*Primary Examiner* — David S Huang
(74) *Attorney, Agent, or Firm* — Polansky & Associates, P.L.L.C.; Paul J. Polansky

(57) ABSTRACT

An integrated circuit includes a first terminal for receiving a data signal, a second terminal for receiving an external reference voltage, a receiver, and a reference voltage generation circuit. The receiver is powered by a power supply voltage with respect to ground and has a first input coupled to the first terminal, a second input for receiving a shared reference voltage, and an output for providing a data input signal. The reference voltage generation circuit is coupled to the second terminal and receives the power supply voltage. The reference voltage generation circuit is operable to form the shared reference voltage by mixing noise from the power supply voltage and noise from the second terminal.

20 Claims, 5 Drawing Sheets

(56) References Cited

U.S. PATENT DOCUMENTS

| | | |
|---|---|---|
| 2006/0124970 A1 | 6/2006 | Heilig |
| 2010/0327957 A1 | 12/2010 | Swartz et al. |
| 2012/0057261 A1* | 3/2012 | Poulton ............... H04L 25/0272 327/87 |
| 2012/0182044 A1* | 7/2012 | Oh ..................... H03K 19/0005 326/30 |
| 2017/0222649 A1 | 8/2017 | Koo et al. |

OTHER PUBLICATIONS

Changho Hyun, Yong-Un Jeong, Suhwan Kim and Joo-Hyung Chae; "An 18-GB/s/pin Single-Ended PAM-4 Transmitter for Memory Interfaces with Adaptive Impedance Matching and Output Level Compensation";white paper; MDPI; Jul. 24, 2021; downloaded from URL https://www.mdpi.com/journal/electronics; 10 pages.

Lejie Lu, Yong Wang, Hui Wu; "An Energy-Efficient High-Swing PAM-4 Voltage-Mode Transmitter"; white paper, International Symposium on Low Power Electronics and Design; Jul. 23, 2018; Seattle, WA, United States; 6 pages.

International Search Report and Written Opinion for International Application No. PCT/US2022/039934, mailed Nov. 24, 2022, 6 pages.

\* cited by examiner

NOISE MITIGATION IN SINGLE-ENDED LINKS

This application is a continuation of U.S. non-provisional application Ser. No. 17/545,108, filed Dec. 28, 2021, entitled "Noise Mitigation in Single-Ended Links," invented by the inventors hereof and assigned to the assignee hereof, and claims priority to U.S. provisional application No. 63/232,343 filed Aug. 12, 2021, and the entire contents of which are incorporated herein by reference.

BACKGROUND

Modern single-ended data transmission systems offer benefits of density that are critical at a system level compared to differential signaling. Systems will continue to push single ended schemes to retain this benefit as we migrate to higher speeds and modulations. The challenges for link performance (e.g., meeting bit error targets, power, area) also greatly increase with the need for higher speed.

Many of these systems are burst mode in nature. In other words, they remain in a low power state (referred as an idle state) while not in use and transition to an active state (i.e., normal transmission or reception of data) when needed. As the physical interface circuit (PHY) enters into an active mode from an idle state, the power delivery networks (PDNs) deal with this burden of sudden changes in loading. A sudden demand for power looks like a step excitation to the PDNs, and causes typical networks to resonate at their natural frequencies. This resonant noise becomes a big source of error that links have to deal with.

Figure 1:
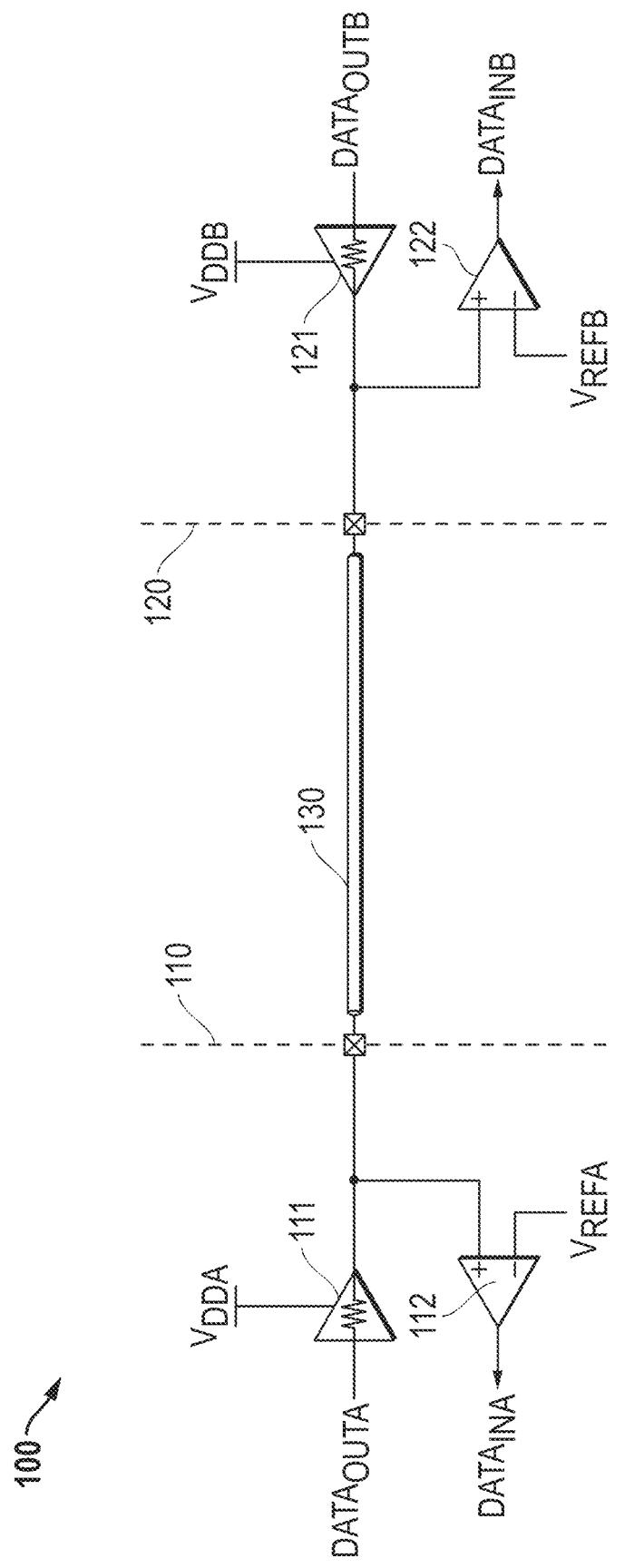
FIG. 1 illustrates in block diagram form a data transmission system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

An integrated circuit includes a first terminal for receiving a data signal, a second terminal for receiving an external reference voltage, a receiver, and a reference voltage generation circuit. The receiver is powered by a power supply voltage with respect to ground and has a first input coupled to the first terminal, a second input for receiving a shared reference voltage, and an output for providing a data input signal. The reference voltage generation circuit is coupled to the second terminal and receives the power supply voltage. The reference voltage generation circuit is operable to form the shared reference voltage by mixing noise from the power supply voltage and noise from the second terminal.

An integrated circuit includes a first terminal for receiving a data signal, a second terminal for receiving an external reference voltage, a receiver, and a reference voltage generation circuit. The receiver is powered by a power supply voltage with respect to ground and has a first input coupled to the first terminal, a second input for receiving a plurality of slicing levels, and an output for providing a data input signal. The reference voltage generation circuit is coupled to the second terminal and receives the power supply voltage. The reference voltage generation circuit is operable to form the plurality of slicing levels by mixing noise from the power supply voltage and noise from the second terminal.

A method includes operating an integrated circuit with a power supply voltage with respect to ground. A data signal is received on a first terminal of the integrated circuit. A shared reference voltage is generated, and the generation includes mixing noise from the power supply voltage with noise on a second terminal of the integrated circuit. The data signal is compared to at least one slicing level formed from the shared reference voltage. A received data signal is provided in response to the comparing.

FIG. 1 illustrates in block diagram form a data transmission system 100 known in the prior art. Data transmission system 100 is a single-ended system and includes an integrated circuit 110, an integrated circuit 120, and a transmission medium 130.

Integrated circuit 110 includes a driver 111 and a comparator 112. Driver 111 has an input for receiving a signal to be output labelled "DATA$_{OUTA}$", an output connected to a terminal of integrated circuit 110, and has a power supply input for receiving a more-positive power supply voltage labelled "V$_{DDA}$" that in conjunction with a more-negative power supply voltage designated "V$_{SSA}$" but not shown in FIG. 1, forms the overall power supply voltage for integrated circuit 110. Comparator 112 has a positive input connected to the integrated circuit terminal of integrated circuit 110, a negative input for receiving a reference voltage labelled "V$_{REFA}$" associated with integrated circuit 110, and an output for providing a signal labelled "DATA$_{INA}$".

Integrated circuit 120 includes a driver 121 and a comparator 122. Driver 121 has an input for receiving a signal to be output labelled "DATA$_{OUTB}$", an output connected to a terminal of integrated circuit 120, and has a power supply input for receiving a more-positive power supply voltage labelled "V$_{DDB}$" that in conjunction with a more-negative power supply voltage designated "V$_{SSB}$" but not shown in FIG. 1, forms the overall power supply voltage for integrated circuit 120. Comparator 122 has a positive input connected to the integrated circuit terminal of integrated circuit 120, a negative input for receiving a reference voltage labelled "V$_{REFB}$" associated with integrated circuit 130, and an output for providing a signal labelled "DATA$_{INB}$".

Transmission medium 130 has a left end connected to the terminal of integrated circuit 110, and a right end connected to the terminal of integrated circuit 120. Transmission medium 130 can be, for example, an integrated circuit trace along a bus in a computer motherboard connected a microprocessor with its associated memory.

Each of drivers 111 and 121 are shown with a resistor indicating they have a drive strength that matches the characteristic impedance of transmission medium 130 and a termination resistance, not shown in FIG. 1, at the inputs to comparators 112 and 122. Moreover, the link is bidirectional, such that sometimes data is transmitted from integrated circuit 110 to integrated circuit 120, and sometimes it is transmitted from integrated circuit 120 to integrated circuit 110. A typical implementation of data transmission system 100 is a graphics double data rate, version 6 (gDDR6) synchronous dynamic random-access memory (SDRAM) and a physical interface of a graphics processor having a gDDR6 memory controller. As technology has advanced, the speed of operation of gDDR memory has increased, such that a typical gDDR6 data transfer speed at low-to-high and high-to-low transitions of a memory clock having a frequency of several GHz. At speeds this high, it is necessary for the memory controller to train the link by providing precise timing delays so that the data can be captured near the center of a "data eye", i.e., a time period and a voltage range in which the data can be reliably captured at the high clock speeds.

The reference voltages at each end of transmission medium 130 can be calibrated to provide data eyes that are as large as possible. Each end of the communication link is susceptible to noise which is reflected on $V_{REFA}$ and $V_{REFB}$. However, the noise sources at the ends of transmission medium 130 are independent of each other because the power distribution networks are likewise independent. These independent noise sources tend to affect the drivers and the receivers differently, causing the data eyes to shrink by shrinking both the eye-height and the eye-width.

Figure 2:
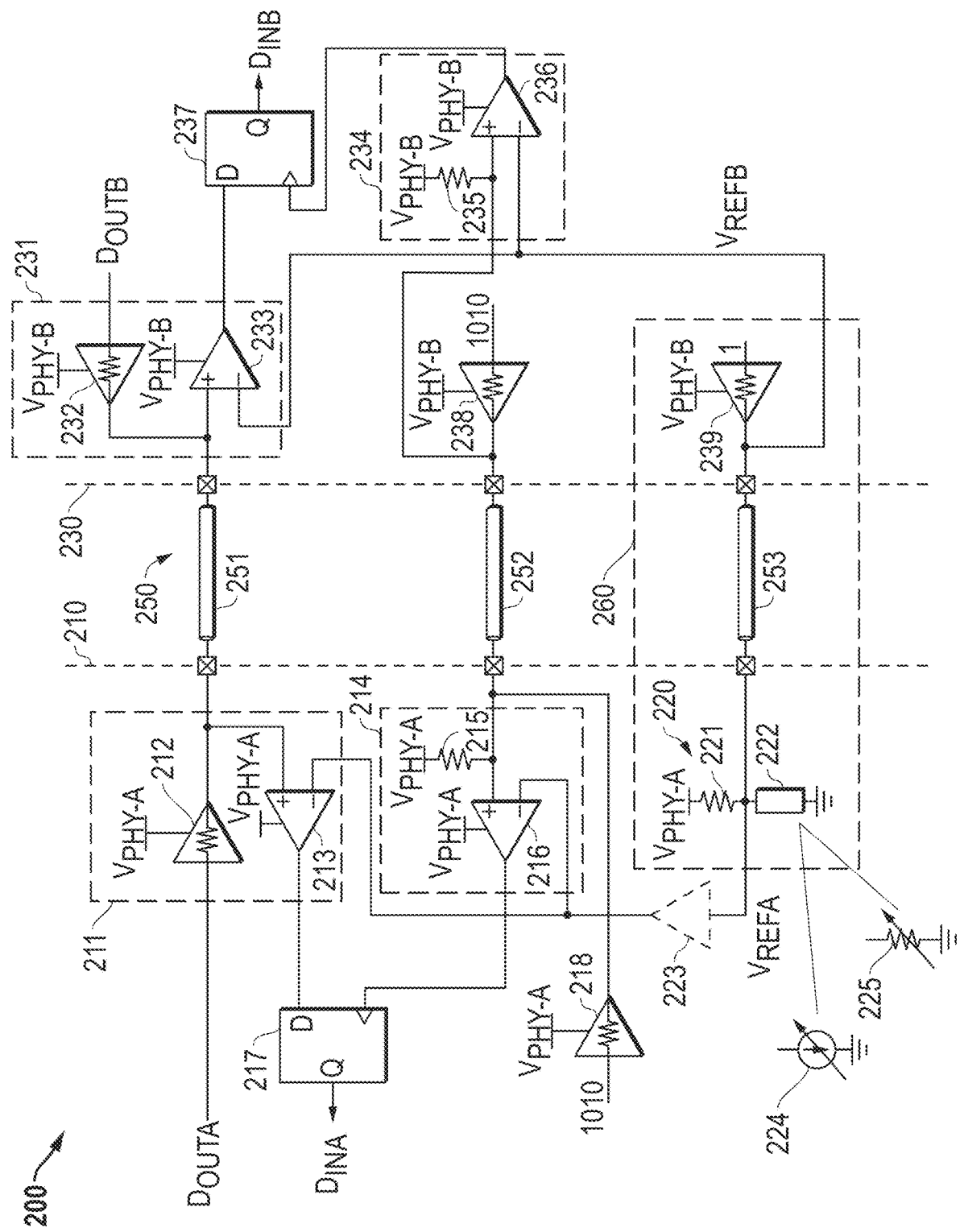
FIG. 2 illustrates in partial block diagram and partial schematic form a data transmission system according to some embodiments.

FIG. 2 illustrates in partial block diagram and partial schematic form a data transmission system 200 according to some embodiments. Data transmission system 200 includes generally an integrated circuit 210, an integrated circuit 230, and a transmission medium 250.

Integrated circuit 210 includes a transceiver 211, a data strobe receiver 214, a latch 217, a data strobe driver 218, a voltage divider 220, and a buffer 223. Transceiver 211 includes a transmitter 212 and a receiver 213. Transmitter 212 has an input for receiving the $D_{OUTA}$ signal, an output connected to a first terminal of integrated circuit 210, and a power supply input for receiving a more-positive power supply voltage labelled "$V_{PHY-A}$" that in conjunction with more-negative power supply voltage $V_{SSA}$ forms the overall power supply voltage for integrated circuit 210. Receiver 213 has a positive input connected to the first integrated circuit terminal, a negative input for receiving reference voltage $V_{REFA}$, an output, and a power supply input for receiving $V_{PHY-A}$. Data strobe receiver 214 includes a resistor 215 and a comparator 216. Resistor 215 has a first terminal for receiving $V_{PHY-A}$, and a second terminal connected to a second terminal of integrated circuit 210. Comparator 216 operates as a data strobe receiver and has a positive input connected to the second integrated circuit terminal, a negative input for receiving reference voltage $V_{REFA}$, an output, and a power supply input for receiving $V_{PHY-A}$. Latch 217 is a clocked D-type latch having a D input connected to the output of receiver 213, a clock input connected to the output of comparator 216, and a Q input for providing the $D_{INA}$ signal. Transmitter 218 has an input for receiving an alternating pattern of 1s and 0s labelled "1010", and an output connected to the second integrated circuit terminal.

Voltage divider 220 includes a resistor 221, and a circuit element 222. Resistor 221 has a first terminal for receiving $V_{PHY-A}$, and a second terminal connected to a third terminal of integrated circuit 210 and forming voltage $V_{REFA}$. Circuit element 222 has a first terminal connected to the second terminal of resistor 221, and a second terminal connected to ground. In some embodiments, circuit element 222 is implemented by a tunable current source 224 having a first terminal connected to the second terminal of resistor 221, and a second terminal connected to ground. In other embodiments, circuit element 222 is implemented by a tunable resistor 225 having a first terminal connected to the second terminal of resistor 221, and a second terminal connected to ground. In still other embodiments, circuit element 222 is implemented by a combination of a tunable current source and a tunable resistor. Buffer 223 is an optional buffer shown in dashed line and has an input connected to the second terminal of resistor 221, and an output connected to the negative inputs of receiver 213 and comparator 216.

Integrated circuit 230 includes a transceiver 231, a data strobe receiver 234, a latch 237, a data strobe transmitter 238, and a driver 239. Transceiver 231 includes a transmitter 232 and a receiver 233. Transmitter 232 has an input for receiving the $D_{OUTB}$ signal, an output connected to a first terminal of integrated circuit 230, and has a power supply input for receiving a more-positive power supply voltage labelled "$V_{PHY-B}$" that in conjunction with more-negative power supply voltage $V_{SSB}$ forms the overall power supply voltage for integrated circuit. Receiver 233 has a positive input connected to a first terminal of integrated circuit 230, a negative input for receiving reference voltage $V_{REFB}$, and an output. Data strobe receiver 234 includes a resistor 235 and a comparator 236. Resistor 235 has a first terminal for receiving $V_{PHY-B}$, and a second terminal forming reference voltage $V_{REFB}$ connected to a second terminal of integrated circuit 230. Comparator 236 has a positive input connected to the second terminal of integrated circuit 230, a negative input for receiving reference voltage $V_{REFB}$, and an output. Latch 237 is a clocked D-type latch having a D input connected to the output of receiver 233, a clock input connected to the output of comparator 236, and a Q output for providing the $D_{INB}$ signal. Transmitter 238 has an input for receiving an alternating pattern of 1s and 0s labelled "1010", and an output connected to the second terminal of integrated circuit 230. Driver 239 has an input for receiving a logic high voltage labelled "1", an output connected to a third terminal of integrated circuit 230 and the negative inputs of receiver 233 and comparator 236 and forming voltage $V_{REFB}$, and a power supply input for receiving $V_{PHY-B}$.

Transmission medium 250 interconnects integrated circuit 210 and integrated circuit 230 and includes a set of conductors 251-253. Conductor 251 has a first end connected to the first terminal of integrated circuit 210, and a second end connected to the first terminal of integrated circuit 230. Conductor 252 has a first end connected to the second terminal of integrated circuit 210, and a second end connected to the second terminal of integrated circuit 230. Conductor 253 has a first end connected to the third terminal of integrated circuit 210, and a second end connected to the third terminal of integrated circuit 230.

As will be described more fully below, driver 239 and voltage divider 220 are connected together by conductor 253 to form a reference voltage generation circuit 260.

Data transmission system 200 bidirectionally interconnects integrated circuit 210 and integrated circuit 230 over transmission medium 250. In the example shown in FIG. 2, integrated circuit 230 is a data processor with an integrated DDRx memory controller and a physical layer interface circuit, and integrated circuit 210 is a DDRx memory. The design of data transmission system 200 will vary based on the type of DDRx memory used. For DDR1, as shown in FIG. 1, integrated circuit 230 uses the data (DQ) signals to send and receive data from integrated circuit 210 based on transitions of a single-ended data strobe signal (DQS). Other generations of DDRx memory will contain modifications of data transmission system 200. In another example, integrated circuit 230 is a graphics processing unit (GPU) with an integrated gDDR memory controller and a physical layer interface circuit, and integrated circuit 210 is a gDDR memory such as a gDDR6 SDRAM or a subsequent gDDR version. According to the gDDR6 standard, the data (DQ) terminals are bidirectional terminals, but the clock signal is a unidirectional, differential signal in which the processor provides differential write clock signals (WCK_t and WCK_c) during both read and write cycles. In yet another example, integrated circuit 230 is a central processing unit (CPU) with an integrated DDR memory controller and a physical layer interface circuit, and integrated circuit 210 is a DDR5 SDRAM. According to the DDR5 standard, the data (DQ) terminals are bidirectional terminals that are captured based on a bidirectional, differential data strobe signal. At the high speeds that gDDR6 and DDR5 memory devices are capable of operating, the data processor (GPU or CPU) performs "data eye training" in which it delays the DQ signal relative to the corresponding clock signal signal so that the clock signal arrives at the data processor aligned to the center of the data eye of the DQS signal. As noted above, however, integrated circuit 210 and integrated circuit 230 receive power from independent PDNs such the noise on the $V_{PHY-A}$ power supply in the first power domain that is independent of noise on the $V_{PHY-B}$ power supply in the second power domain. These variations operate to close the data eye, i.e., they make the height and/or width of the data eye smaller.

According to various embodiments disclosed herein, however, data transmission system 200 includes a reference voltage generation circuit 260 that forms a reference voltage used in a receiver (e.g., $V_{REFA}$ used in receiver 213 and comparator 216) by mixing a first signal generated by the first circuit (e.g., $V_{REFA}$ generated by voltage divider 220) based on the first power supply voltage (e.g., $V_{PHY-A}$) and a second signal generated by the second circuit (e.g., $V_{REFB}$ generated by driver 239) based on the second power supply voltage (e.g., $V_{PHY-B}$). Reference voltage generation circuit 260 creates a reference voltage $V_{REFA}$ that carries the noise properties of both $V_{PHY-A}$ and $V_{PHY-B}$. $V_{REFA}$ is then used in receiver 213 and comparator 216 to receive the DQ and DQS signals, respectively, in integrated circuit 210. Mixing the power supply noise from the opposite end of the communication link to form a reference voltage used in receiving data at the given side of the communication link has the remarkable property of enlarging the DQ data eye to make data reception more robust. In other embodiments, $V_{REF}$ can be formed by mixing $V_{SS}$ noise on the PDNs of integrated circuits 210 and 230. In this case, driver 239 would receive a logic "0" at its input representative of the $V_{SSB}$ voltage, and voltage divider 220 could form $V_{REFA}$ and $V_{REFB}$ by reversing the order of resistor 221 and circuit element 222. In addition, driver 239 would have a pulldown drive strength that matches the resistance of resistor 221.

In addition, as will be described further below, the significantly more robust data reception enables higher overall data transmission rates by allowing the implementation of a multi-level data transmission and reception system instead of a conventional two-level system. For example, instead of conventional binary data transmission used in existing versions of the DDR and the graphics DDR standards, a four-level pulse amplitude modulation (PAM4) system can be created that allows the transmission and reception of two binary bits for each clock transition instead of just two. Thus, the data transmission bandwidth can be doubled for a given clock speed.

Figure 3:
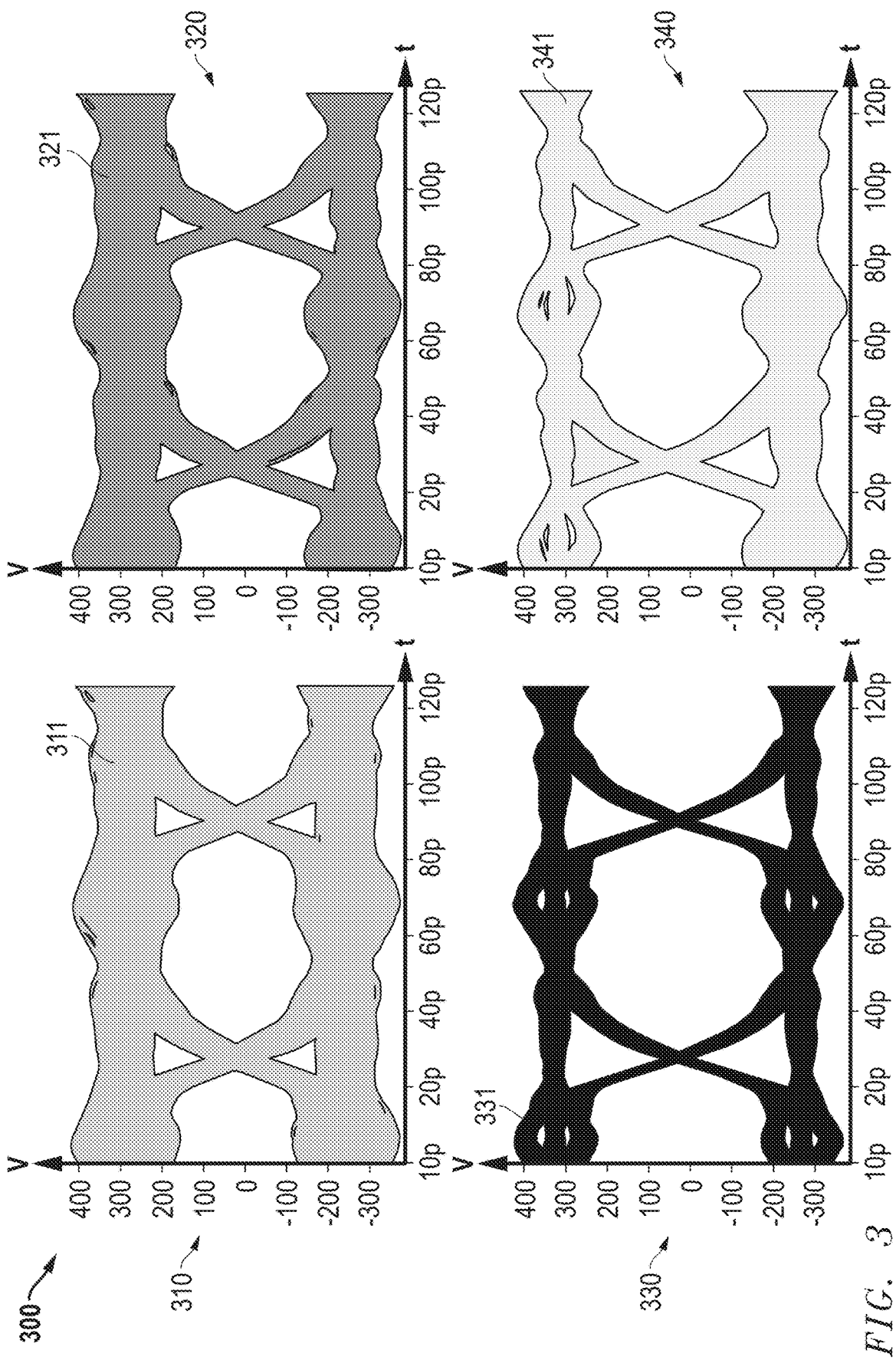
FIG. 3 illustrates a set of timing diagrams useful for understanding the operation of the data transmission system of FIG. 2.

FIG. 3 illustrates a set of timing diagrams 300 useful for understanding the operation of data transmission system 200 of FIG. 2. Timing diagrams 300 include data eye diagrams 310, 320, 330, and 340. Each data eye diagram has a respective horizontal axis representing time in picoseconds (ps), and a respective vertical axis representing amplitude in volts. Data eye diagrams 310, 320, 330, and 340 show waveform clouds resulting from the superposition of both low-to-high transitions and high-to-low transitions and a group of data signals, e.g., a byte, for which a memory controller sets a capture delay. The left column of diagrams, i.e., data eye diagrams 311 and 331, show data signals received at integrated circuit 210, in which data eye diagram 311 shows the conventional method of generating $V_{REF}$, and data eye diagram 331 shows the mixing technique of generating $V_{REF}$ according to the various embodiments described herein. Similarly, the right column of diagrams, i.e., data eye diagrams 321 and 341, show data signals received at integrated circuit 230, in which data eye diagram 321 shows the conventional method of generating $V_{REF}$, and data eye diagram 341 shows the mixing technique of generating $V_{REF}$ according to the various embodiments described herein. As can be clearly seen, the data eye diagrams formed using the mixing techniques described herein exhibit sharper data eyes with greater eye-height and greater eye width.

These experimental observations shown in the graphs of FIG. 3 confirm the significant improvement in data transmission fidelity using the mixing technique disclosed herein compared to existing data transmission systems.

Figure 4:
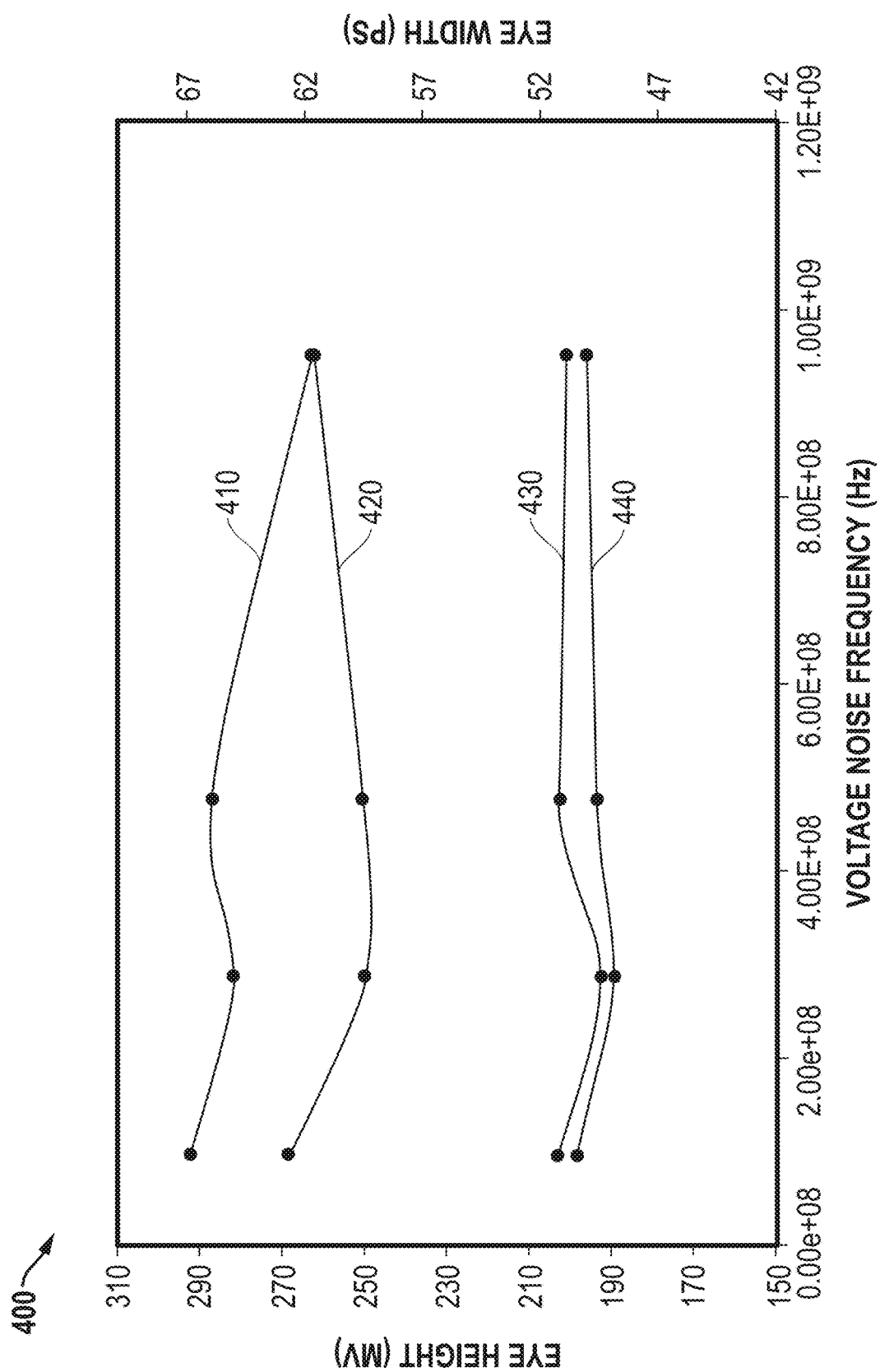
FIG. 4 illustrates a graph showing an example of the height and width of the data eye measured at various data noise frequencies when the data transmission system of FIG. 2.

FIG. 4 illustrates a graph 400 showing an example of the height and width of the data eye measured at various data noise frequencies when data transmission system 200 of FIG. 2. In FIG. 4, the horizontal axis represents frequency in Hz, the left vertical axis represents eye height in millivolts (mV), and the right vertical axis represents eye width in ps. Shown in graph 400 are four waveforms of interest, including a waveform 410 showing the eye-height of a data eye using the $V_{REF}$ mixing techniques disclosed herein; a waveform 420 showing the eye-height of a data eye using conventional $V_{REF}$ generating techniques; a waveform 430 showing the eye-width of a data eye using the $V_{REF}$ mixing techniques disclosed herein; a waveform 440 showing the eye-height of a data eye using conventional $V_{REF}$ generating techniques. As can be seen from waveforms 410 and 420, the eye-height improves by as much as about 37 mV for a power supply of 0.8 volts through voltage noise frequencies up to about 500 MHz, before declining gradually until reaching a cross-over point at about 950 MHz. The eye widths show a consistent but less dramatic improvement across all voltage noise frequencies. At a voltage noise frequency of particularly interest, namely 100 MHz, the eye-height improves by 24 mV and the eye width by 0.8 ps.

Figure 5:
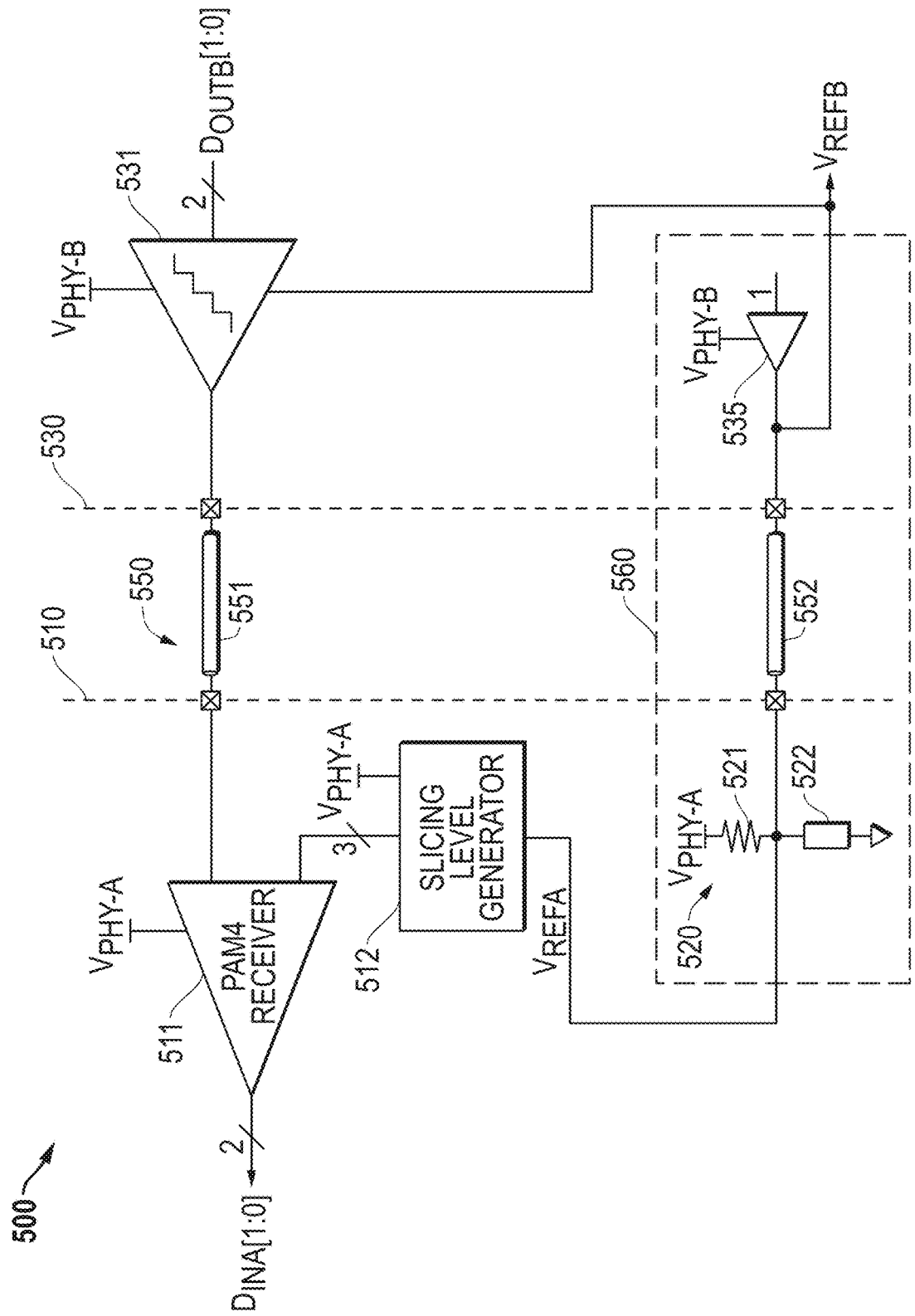
FIG. 5 illustrates in partial block diagram and partial schematic form a data transmission system useful in a multiple-level data transmission systems according to some embodiments.

FIG. 5 illustrates in partial block diagram and partial schematic form a data transmission system 500 useful in a multiple-level data transmission systems according to some embodiments. Data transmission system 500 is includes an integrated circuit 510, an integrated circuit 530, and a transmission medium 550.

Integrated circuit 510 includes a four-level pulse amplitude modulation (PAM4) receiver 511, a slicing level generator 512, and a voltage divider 520. PAM4 receiver 511 has a signal input connected to a bonding pad of integrated circuit 510, a reference input, an output for providing a decoded voltage signal labelled "$D_{INA}[1:0]$", and a power supply input for receiving $V_{PHY-A}$. Slicing level generator 512 has an input for receiving $V_{REFA}$, a power supply input for receiving $V_{PHY-A}$, and an output connected to the second input of PAM4 receiver 511 for providing three slicing levels thereto. Voltage divider 520 includes a resistor 521, and a circuit element 522. Resistor 521 has a first terminal for receiving $V_{PHY-A}$, and a second terminal forming $V_{REFA}$ and connected to a second terminal of integrated circuit 510. Circuit element 522 has a first terminal connected to the second terminal of resistor 521, and a second terminal connected to ground. As in voltage divider 220, in some embodiments, circuit element 522 is implemented by a tunable current source having a first terminal connected to the second terminal of resistor 521, and a second terminal connected to ground. In other embodiments, circuit element 522 is implemented by a tunable resistor having a first terminal connected to the second terminal of resistor 521, and a second terminal connected to ground. In still other embodiments, circuit element 522 is implemented by a combination of a tunable current source and a tunable resistor.

Integrated circuit 530 includes a PAM4 transmitter 531 and a driver 535. PAM4 transmitter 531 has an input for receiving a two-bit output signal labelled "$D_{OUTB}[1:0]$", a power supply input for receiving $V_{PHY-B}$, a reference input for receiving $V_{REFB}$, and an output connected to a first terminal of integrated circuit 530. Driver 535 has in input for receiving a logic high voltage level labelled "1", an output connected to a first terminal of integrated circuit 230, and has a power supply input for receiving $V_{PHY-B}$.

Transmission medium 550 includes a conductor 551 and a conductor 552. Conductor 551 has a first end connected to the first terminal of integrated circuit 530, and a second end connected to the first terminal of integrated circuit 510. Conductor 552 has a first end connected to the second terminal of integrated circuit 530, and a second end connected to the second terminal of integrated circuit 510. Driver 535 and voltage divider 520 are connected together by conductor 552 to form a reference voltage generation circuit 560.

Data transmission system 500 operates in much the same way as data transmission system 200 of FIG. 2, but implements PAM4 encoding and decoding. PAM4 allows the effective doubling of data transmission throughput for a given clock frequency by encoding two bits of data as one of four voltage levels transmitted at each clock edge. According to PAM4, the voltage levels are encoded into the four levels as shown in TABLE I below:

TABLE I

| Symbol | D[1:0] | Voltage Level V |
|---|---|---|
| 0 | [00] | $V_{INA} < \frac{1}{4} V_{PHY-A}$ |
| 1 | [01] | $\frac{1}{4}V_{PHY-A} < V_{INA} < \frac{1}{2}V_{PHY-A}$ |
| 2 | [10] | $\frac{1}{2}V_{PHY-A} < V_{INA} < \frac{3}{4}V_{PHY-A}$ |
| 3 | [11] | $V_{INA} > \frac{3}{4}V_{PHY-A}$ |

To decode the voltage into the appropriate symbol and its corresponding data, slicing level generator 512 generates three slicing levels at values equal to $\frac{1}{4}V_{PHY-A}$, $\frac{1}{2}V_{PHY-A}$, and $\frac{3}{4}V_{PHY-A}$. Slicing level generator 512 can generate the three slicing levels while injecting power supply noise mixed from integrated circuit 510 and integrated circuit 530 based on $V_{REFA}$ in a variety of ways. In one example, integrated circuit 510 and integrated circuit 530 generate $V_{REFA}$ and $V_{REFB}$ at one-half the voltage of $V_{PHY-A}$ and $V_{PHY-B}$, respectively. In this case, slicing level generator 512 incorporates a string of four equal-valued resistors between the $V_{PHY-A}$ power supply and ground, in which it generates the value of $\frac{3}{4}V_{PHY-A}$ at the connection point between the top and top-middle resistors, and $\frac{1}{4}V_{PHY-A}$ at the connection point between the bottom-middle resistor and the bottom resistors. In this example, a buffer has an input for receiving $V_{REFA}$ and an output for driving the connection point between the top-middle and bottom-middle resistors. Because $V_{REFA}$ mixes noise from the PDNs of both integrated circuit 510 and integrated circuit 530, slicing level generator 512 outputs slicing levels with both of these noise components. By the use of the reference voltage with power supply noise mixed from both ends of the communication link, the data eyes will also exhibit improved eye-openings as those described above for binary signal transmission.

In some embodiments, the resistors in the resistor string could be made programmable, and could be trained to set the slicing levels at the crossover point of the levels in the data eye. For example, sometimes data eyes exhibit an asymmetry that skews the data eye center higher or lower. A calibration process could be used to make these adjustments for an even more robust data transmission and reception.

Thus, the technique disclosed herein can be used to improve data transmission bandwidth by transmitting non-binary symbols, i.e., symbols having more than two states per clock edge. It is believed that the noise-mitigation techniques may allow PAM4 reception in systems that would not otherwise be robust enough to decode the four voltage levels use in PAM4 symbols at existing clock speeds.

An integrated circuit or integrated circuits containing the reference voltage generation circuits described herein, or any portions thereof, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, while the present application describes a binary (i.e., 2-level) data transmission and reception system in detail, in some embodiments, the noise mitigation can be used in data transmission systems that transmit more than one bit per clock edge, such as PAM4. Moreover, different pieces of the reference voltage generation circuit can be implemented in different parts of the integrated circuits. The reference voltage generation circuit can also have voltage dividers and/or drivers at both ends of the transmission medium, or at only one end. The disclosed technique is applicable to a wide variety of integrated circuits that use high-speed data transmission. In one particular example, one integrated circuit can be a data processor, system-on-chip (SOC), or graphics processing unit (GPU), while the other integrated circuit is a DDR or gDDR SDRAM, but the techniques described herein can be used with many other types of integrated circuits. The transmission medium can also vary between embodiments, and may include printed circuit board traces, bond wires, through-silicon vias (TSVs), and the like.

Accordingly, it is intended by the appended claims to cover all modifications of the disclosed embodiments that fall within the scope of the disclosed embodiments.

What is claimed is:

1. An integrated circuit, comprising:
a first terminal for receiving a data signal;
a second terminal for receiving an external reference voltage;
a receiver powered by a power supply voltage with respect to ground and having a first input coupled to the first terminal, a second input for receiving a shared reference voltage, and an output for providing a data input signal; and
a reference voltage generation circuit coupled to the second terminal and receiving the power supply voltage, the reference voltage generation circuit operable to form the shared reference voltage by mixing noise from the power supply voltage and noise from the second terminal.

2. The integrated circuit of claim 1, further comprising:
a transmitter having an input for receiving an internal data signal, and an output coupled to the first terminal.

3. The integrated circuit of claim 1, wherein the reference voltage generation circuit comprises:
a voltage divider powered by the power supply voltage and coupled to the second terminal, and operable to provide the shared reference voltage.

4. The integrated circuit of claim 3, wherein the voltage divider comprises:
a resistor having a first terminal coupled to the second terminal, and a second terminal forming the shared reference voltage; and
a second circuit element having a first terminal coupled to the second terminal of the resistor, and a second terminal coupled to ground.

5. The integrated circuit of claim 4, wherein the second circuit element comprises:
a variable current source having a first terminal coupled to the second terminal of the resistor, and a second terminal coupled to ground.

6. The integrated circuit of claim 4, wherein the second circuit element comprises:
a variable resistor having a first terminal coupled to the second terminal of the resistor, and a second terminal coupled to ground.

7. The integrated circuit of claim 1, further comprising:
a third terminal;
a data strobe receiver powered by the power supply voltage and having a first input coupled to the third terminal, and second input for receiving the shared reference voltage, and an output; and
a latch having a data input coupled to the output of the receiver, a clock input coupled to the output of the data strobe receiver, and an output for providing a latched data signal.

8. An integrated circuit, comprising:
a first terminal for receiving a data signal;
a second terminal for receiving an external reference voltage;
a receiver powered by a power supply voltage with respect to ground and having a first input coupled to the first terminal, a second input for receiving a plurality of slicing levels, and an output for providing a data input signal; and
a reference voltage generation circuit coupled to the second terminal and receiving the power supply voltage, the reference voltage generation circuit operable to form the plurality of slicing levels by mixing noise from the power supply voltage and noise from the second terminal.

9. The integrated circuit of claim 8, wherein the reference voltage generation circuit comprises:
a voltage divider coupled to the first terminal, the voltage divider operable to form a shared reference voltage by mixing noise from the power supply voltage and the noise from the second terminal; and
a slicing level generator having an input for receiving the shared reference voltage, and an output coupled to the second input of the receiving for providing the plurality of slicing levels thereto.

10. The integrated circuit of claim 9, wherein the voltage divider comprises:
a resistor having a first terminal coupled to the second terminal, and a second terminal forming the shared reference voltage; and
a second circuit element having a first terminal coupled to the second terminal of the resistor, and a second terminal coupled to ground.

11. The integrated circuit of claim 10, wherein the second circuit element comprises:
a variable current source having a first terminal coupled to the second terminal of the resistor, and a second terminal coupled to ground.

12. The integrated circuit of claim 10, wherein the second circuit element comprises:
a variable resistor having a first terminal coupled to the second terminal of the resistor, and a second terminal coupled to ground.

13. The integrated circuit of claim 8, wherein:
the output of the receiver is a multi-bit digital signal and the receiver uses the plurality of slicing levels to decode the multi-bit digital signal.

14. A method, comprising:
operating an integrated circuit with a power supply voltage with respect to ground;
receiving a data signal on a first terminal of the integrated circuit;
generating a shared reference voltage, the generating comprising mixing noise from the power supply voltage with noise on a second terminal of the integrated circuit;
comparing the data signal to at least one slicing level formed from the shared reference voltage; and
providing a received data signal in response to the comparing.

15. The method of claim 14, wherein the generating the shared reference voltage comprises:
dividing the power supply voltage using a resistor having a first terminal for receiving the power supply voltage, and a second terminal coupled to the second terminal, and a second circuit element having a first terminal coupled to the second terminal, and a second terminal coupled to ground.

16. The method of claim 15, wherein the dividing comprises:
dividing using a variable current source as the second circuit element.

17. The method of claim 15, wherein the dividing comprises:
dividing using a variable resistor as the second circuit element.

18. The method of claim 14, further comprising
receiving a strobe signal on a third terminal of the integrated circuit; and
latching the received data signal using the strobe signal.

19. The method of claim 14, wherein comparing the data signal to the at least one slicing level comprises:
comparing the data signal to a plurality of slicing levels.

20. The method of claim 19, wherein providing the received data signal in response to the comparing comprises:
providing the received data signal as a multi-bit signal in response to the comparing.

* * * * *